United States Patent [19]

Akiyama et al.

[11] Patent Number: 4,532,004

[45] Date of Patent: Jul. 30, 1985

[54] METHOD OF MANUFACTURING A SEMICONDUCTOR DEVICE

[75] Inventors: Tatsuo Akiyama, Tokyo; Yutaka Koshino, Yokosuka; Shunichi Hiraki, Hyogo, all of Japan

[73] Assignee: Kabushiki Kaisha Toshiba, Japan

[21] Appl. No.: 636,221

[22] Filed: Jul. 31, 1984

[30] Foreign Application Priority Data

Aug. 1, 1983 [JP] Japan ................................ 58-140872

[51] Int. Cl.$^3$ ...................... H01L 21/306; B44C 1/22; C03C 15/00; C23F 1/02
[52] U.S. Cl. ...................... 156/653; 29/571; 148/187; 156/643; 156/657; 156/659.1; 156/662; 204/192 EC; 357/41; 357/65; 427/38; 427/88; 427/93; 427/94
[58] Field of Search .................... 148/1.5, 187; 29/571, 29/580, 591, 576 B; 357/41, 42, 59, 65; 427/38, 39, 86, 88, 93, 94; 156/643, 653, 656, 657, 659.1, 662; 204/192 EC, 192 E

[56] References Cited

U.S. PATENT DOCUMENTS 4,347,654 9/1982 Allen et al. .................... 29/576 B
4,351,099 9/1982 Takagi et al. .................... 29/571

OTHER PUBLICATIONS

Yamasaki et al., "Self-Align Implantation for n+-Layer Technology (SAINT) for High Speed GaAs ICs," Electronics Letters, vol. 18, No. 3, pp. 119-121, Feb. 4, 1982.

Transactions of the Institute of Electronics and Communications Engineers (Japan) Meeting (Semiconductor Material Department) M. Furuzuka (transliterated) et al.,; pp. 115-116, Sep. 1983.

*Primary Examiner*—William A. Powell
*Attorney, Agent, or Firm*—Finnegan, Henderson, Farabow, Garrett & Dunner

[57] ABSTRACT

A method of manufacturing a GaAs FET is disclosed. In this manufacturing method, a protection film is formed on a GaAs substrate and a dummy gate electrode is formed thereon. A channel length setting film is isotropically formed on the dummy gate electrode to have a constant thickness. Then, an impurity is ion-implanted in the channel length setting film. Thereafter, the channel length setting film is removed. An etching preventive film is anisotropically formed along a substantially vertical direction with respect to the GaAs substrate. The dummy gate electrode is etched using the etching preventive film as a mask so as to form a first opening in the etching preventive film. Then, a second opening is formed in the region of the protection film corresponding to the region in which the dummy gate electrode was present. A gate electrode is formed to be in contact with the GaAs substrate through the first and second openings.

6 Claims, 21 Drawing Figures

METHOD OF MANUFACTURING A SEMICONDUCTOR DEVICE

BACKGROUND OF THE INVENTION

The present invention relates to a method of manufacturing a semiconductor device, and, more particularly, to a method of manufacturing a high frequency (HF) low-noise element such as a gallium arsenide (GaAs) field effect transistor (FET).

Some methods for forming a HF low-noise element such as a GaAs FET, in which a gate length and a channel length must be precisely determined, are conventionally known.

FIGS. 1A to 1D show one of these methods. Referring to these figures, a gate metal film 12 of a refractory metal such as TiW is formed on a GaAs substrate 11. Then, a photoresist pattern 13 is formed on the gate metal film 12 (FIG. 1A). The gate metal film 12 is patterned using the photoresist pattern 13 as a mask to form a gate electrode 12G (FIG. 1B). Thereafter, silicon is ion-implanted in the GaAs substrate 11 using the photoresist pattern 13 and gate electrode 12G as a mask. The ion-implanted silicon is activated by annealing to form $n^+$-type source and drain regions 14 and 15 (FIG. 1C). Then, in order to provide proper respective distances (or spaces) between the gate electrode 12G and the $n^+$-type source and drain regions 14 and 15, the gate electrode 12G is side-etched to positions indicated by dotted lines 16 (FIG. 1D). This side-etching is performed for the following reasons. In a GaAs FET, in order to form a Schottky junction between a gate electrode and a GaAs substrate, a metal electrode is formed on a substrate (i.e., the gate electrode 12 formed on the GaAs substrate 11). In this case, if the gate electrode 12G is formed to be in contact with or in the vicinity of the $n^+$-type source and drain regions 14 and 15, a breakdown voltage of an element becomes undesirably low. In order to prevent such a problem, proper respective distances must be provided between the gate electrode 12G and the $n^+$-type source and drain regions 14 and 15. Therefore, the side-etching described above is performed.

However, in the above manufacturing method shown in FIGS. 1A to 1D, it is difficult to precisely control the above side-etching. In the worst case, the gate electrode 12G may become disconnected after etching. Furthermore, in an ion-implantation process, the surface of the substrate is bombarded by ions to become roughened and a damaged layer is formed thereon. In an annealing process of an ion-implanted impurity for activation, the gate electrode 12G reacts with the GaAs substrate 11. Then, Schottky characteristics are degraded, or As in the GaAs substrate 11 is evaporated, thereby causing degradation of the semiconductor's characteristics.

A method shown in FIGS. 2A to 2F can solve these problems. A silicon nitride ($Si_3N_4$) film as a protection film 17 is formed on a GaAs substrate 11 by plasma chemical vapor deposition (CVD). A first photoresist film 18 is deposited on the film 17. Then, a silicon oxide ($SiO_2$) film 19 is formed on the photoresist film 18 by sputtering CVD. A second photoresist pattern 20 is formed on the $SiO_2$ film 19. Then, a multilayer comprising the first photoresist film 18 and the $SiO_2$ film 19 is patterned using the second photoresist pattern 20 as a mask (FIG. 2B). Thereafter, silicon is ion-implanted in the GaAs substrate 11 using a multilayer of the first photoresist film 18, the $SiO_2$ film 19 and the second photoresist pattern 20 as a mask so as to form $n^+$-type source and drain regions 14 and 15 defining a channel of a predetermined length Lch therebetween, as shown in FIG. 2B. Subsequently, the first photoresist film 18 is side-etched to positions indicated by the dotted lines 21 (FIG. 2C). A silicon oxide film 22 is formed on the $Si_3N_4$ film 17 using the photoresist film 18 as a mask (FIG. 2D). Then, the first photoresist film 18 is removed by etching using the silicon oxide film 22 as a mask. By this etching, the overlying $SiO_2$ film 19 and second photoresist pattern 20 are also removed. At this time, annealing for impurity activation is performed. When the $Si_3N_4$ film 17 is subsequently etched using the silicon oxide film 22 as a mask, an opening H is formed in a portion of the $Si_3N_4$ film 17 corresponding to a region on which the photoresist film 18 was formed (FIG. 2E). A metal film is formed on the $Si_3N_4$ film 17 and is patterned, whereby a gate electrode 23 having a predetermined gate length Lg is formed to be in contact with the substrate 11 through the opening H (FIG. 2F).

According to the manufacturing method shown in FIGS. 2A to 2F, some problems can be prevented by the presence of the protection film 17. In other words, formation of a damaged layer on the surface of the substrate 11 by ion-implantation or annealing, degradation of Schottky characteristics caused by a reaction between the gate electrode 23 and the substrate 11, evaporation of As from the substrate 11, and the like can be prevented. However, in this case, the precision of the gate length Lg depends on that of the side-etching. Since the side-etching cannot be precisely controlled, it is difficult to precisely determine the respective distances between the gate electrode 23, and the $n^+$-type source and drain regions 14 and 15.

There is conventionally provided a method shown in FIGS. 3A to 3B for precisely controlling the respective distances between the gate electrode 23, and the $n^+$-type source and drain regions 14 and 15. According to this method, first, a gate electrode 23 having a predetermined gate length Lg is formed on a GaAs substrate 11 (FIG. 3A). Then, a silicon nitride film 24 is isotropically formed by plasma CVD so as to cover the gate electrode 23 and the exposed surface of the GaAs substrate 11 (FIG. 3B). In other words, a silicon nitride film 24 having a constant thickness is formed over and around the gate electrode 23 and on the exposed surface of the GaAs substrate 11. The silicon nitride film 24 which is formed on the gate electrode 23 and the substrate 11 is removed by anisotropic etching, e.g., RIE (reactive ion etching), sputtering, ion-milling, or the like so as to leave the silicon nitride film 24 only on the side surfaces of the gate electrode 23 (FIG. 3C). Silicon is ion-implanted in the substrate 11 using the gate electrode 23 and the silicon nitride film 24 remaining on the side surfaces thereof as a mask. Thereafter, the resultant structure is annealed to activate the ion-implanted silicon, whereby source and drain regions 14 and 15 are formed (FIG. 3D).

In the manufacturing method shown in FIGS. 3A to 3D, the thickness of the silicon nitride film 24 formed on the side surfaces of the gate electrode 23 can be precisely controlled. Therefore, the gate length Lg and channel length Lch can be precisely set. Furthermore, the respective distances between the gate electrode 23, and the source and drain regions 14 and 15 can also be precisely set.

However, when the silicon nitride film 24 is etched, a damaged layer is formed on the surface of the substrate 11. Since the gate electrode 23 is in direct contact with the substrate 11, the gate electrode 23 reacts with the GaAs substrate 11 during annealing for impurity activation, whereby Schottky junction characteristics therebetween are degraded, and As is evaporated from the substrate 11.

SUMMARY OF THE INVENTION

The present invention has been made in consideration of the above situation, and has as its object to provide a method of manufacturing a semiconductor device, wherein gate and channel lengths can be set with high precision, respective distances between a gate electrode, and source and drain regions can also be set with high precision, formation of a damaged layer and degradation of Schottky junction characteristics can be prevented and an improvement in a breakdown voltage can be achieved.

According to the invention, there is provided a method of manufacturing a semiconductor device, comprising the steps of: forming an insulating protection film on a semiconductor substrate; forming a dummy gate electrode on said protection film; forming a distance setting film having a constant thickness on an exposed surface of said protection film and upper and side surfaces of said dummy gate electrode; ion-implanting an impurity in said semiconductor substrate using said dummy gate electrode and regions of said distance setting film which are respectively formed on the upper and side surfaces of said dummy gate electrode as a mask so as to a form source and drain region, respectively; etching said distance setting film; forming an etching preventive film on an exposed surface of said protection film; etching said dummy gate electrode using said etching preventive film formed on said protection film as a mask so as to form a first opening; etching a region of said protection film corresponding to a region in which said dummy gate electrode was present so as to form a second opening thereby exposing a portion of said semiconductor substrate; and forming a metal gate electrode to be in contact with said semiconductor substrate through said first and second openings.

DETAILED DESCRIPTION OF THE PREFERRED EMBODIMENT

An embodiment of the present invention will be described with reference to FIGS. 4A to 4G.

Figure 1A:
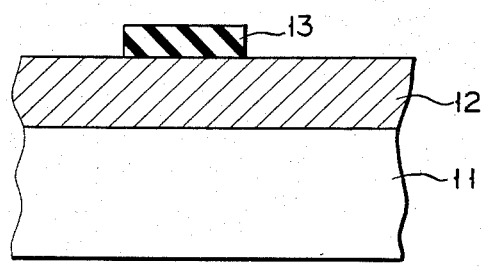
FIGS. 1A to 1D are views sequentially showing structures in a conventional method of manufacturing a semiconductor device.
Figure 1B:
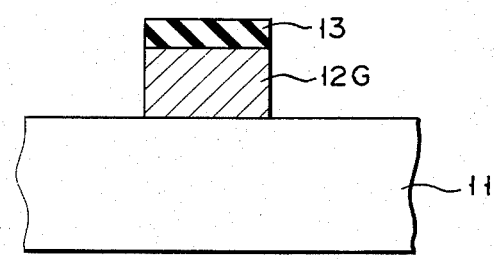
Figure 1C:
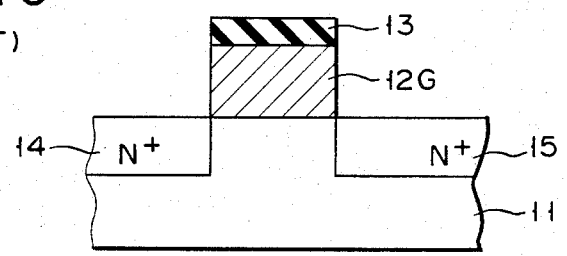
Figure 1D:
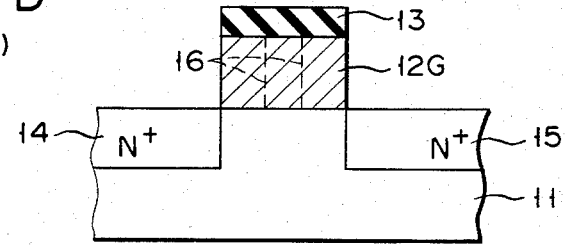
Figure 2A:
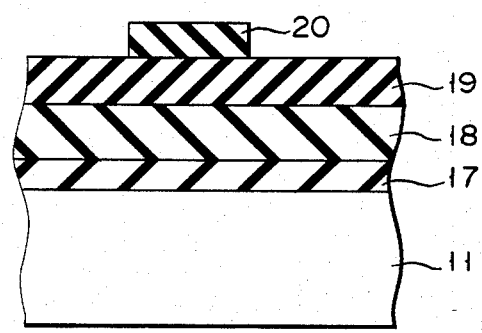
FIGS. 2A to 2F are views sequentially showing structures in another conventional method.
Figure 2B:
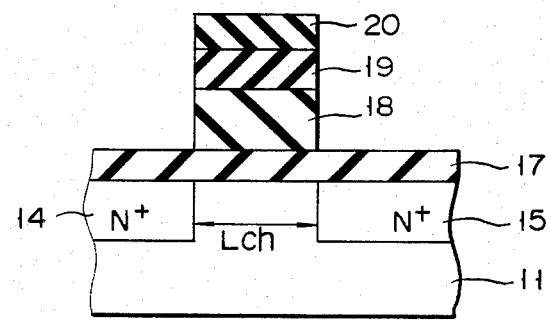
Figure 2C:
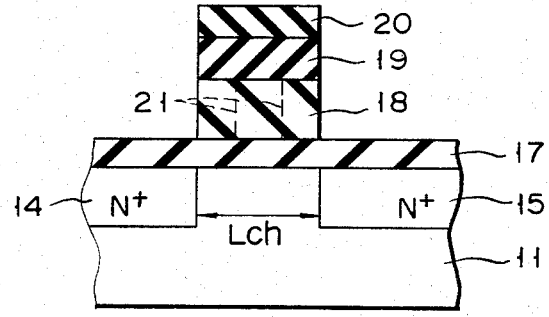
Figure 2D:
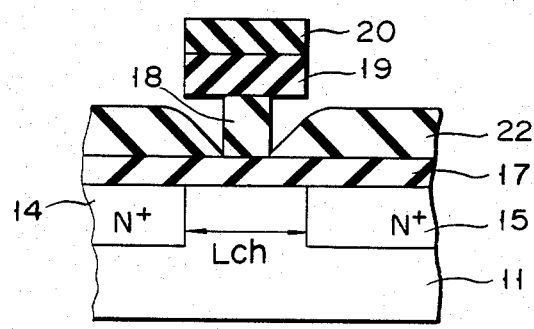
Figure 2E:
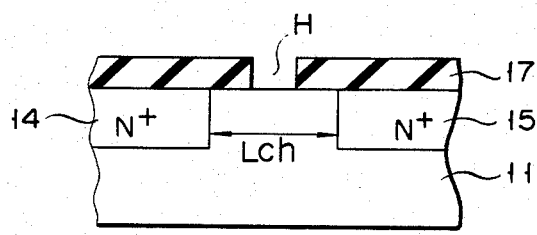
Figure 2F:
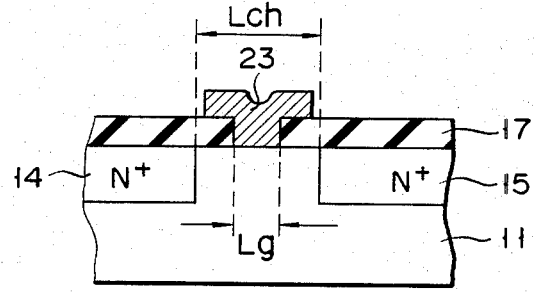
Figure 3A:
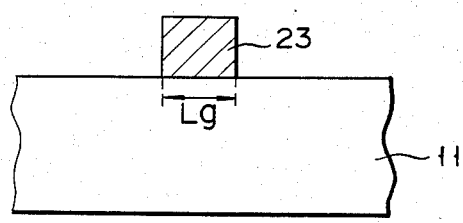
FIGS. 3A to 3D are views sequentially showing structures in still another conventional method.
Figure 3B:
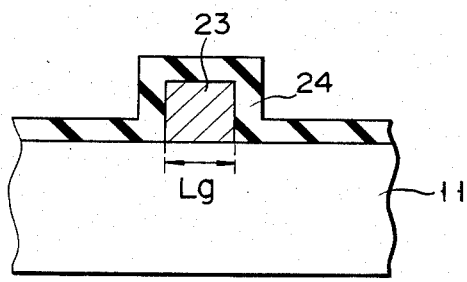
Figure 3C:
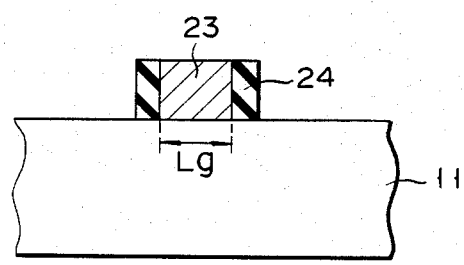
Figure 3D:
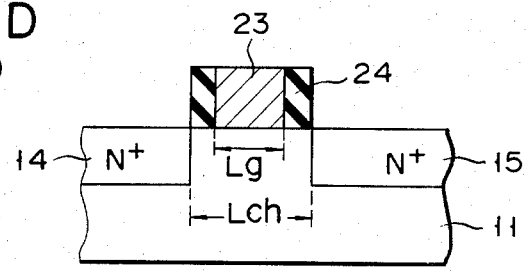
Figure 4A:
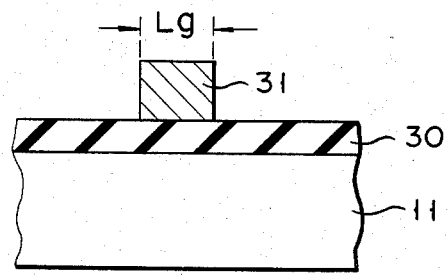
FIGS. 4A to 4G are views sequentially showing structures in a method of manufacturing a semiconductor device according to an embodiment of the present invention.
Figure 4B:
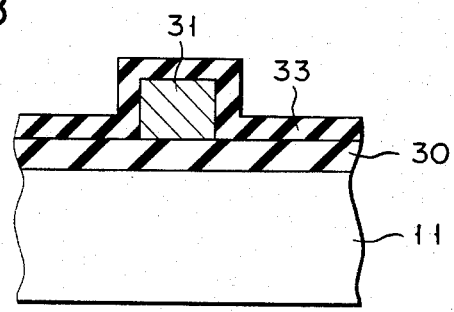
Figure 4C:
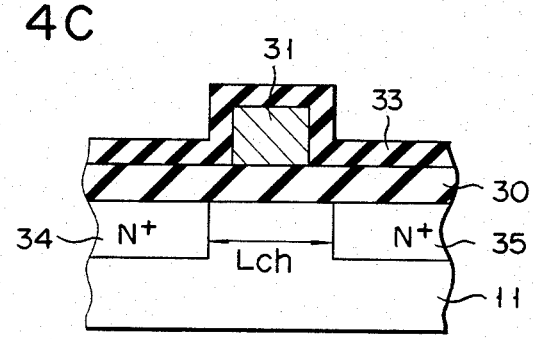
Figure 4D:
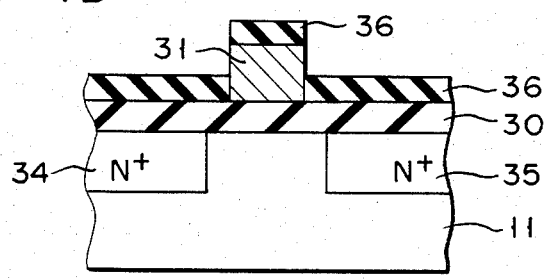
Figure 4E:
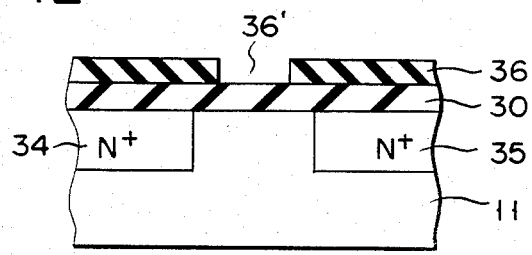

A silicon nitride (insulation) film 30 as a protection film is formed on a GaAs substrate 11 by plasma CVD (FIG. 4A). Then, a polysilicon layer is formed on the silicon nitride film 30 by CVD. The polysilicon layer is patterned by a conventional etching technique to form a dummy gate electrode 31 having a desired gate length Lg (FIG. 4A). A thickness of the dummy gate electrode 31 (a thickness along the vertical direction with respect to the substrate 11) is 6,000 Å, for example, and it is thick enough to serve as a mask for $Si^+$-implantation. Next, a silicon oxide film 33 having a uniform thickness is isotropically formed by plasma CVD to cover the entire surface of the resultant structure (i.e., upper and side surfaces of the dummy gate electrode 31, and an exposed surface of the silicon nitride film 30) (FIG. 4B). The silicon oxide film 33 is formed for setting respective distances between a gate electrode, and source and drain regions (both are formed later). The silicon oxide film 33 has a uniform thickness of about 2,000 Å. Then, silicon is ion-implanted in the substrate 11. The resultant structure is annealed to activate the ion-implanted silicon, whereby source and drain regions 34 and 35 having a channel length Lch therebetween are formed (FIG. 4C). Since the thickness of the dummy gate electrode 31 is considerable, the thickness of the silicon oxide film 33 for setting distance is sufficient along a vertical direction with respect to the substrate 11. Therefore, the silicon oxide film 33 formed on the side surfaces of the dummy electrode 31 serves as a mask during ion-implantation. Accordingly, the distance between the source and drain regions 34 and 35, that is, the channel length Lch is equal to the sum of the length substantially twice the thickness of the silicon oxide film and a width of the dummy gate electrode 31. Subsequently, the silicon oxide film 33 formed on the side surfaces of the dummy gate electrode 31 is entirely removed. Thereafter, a silicon oxide film 36 serving as an etching preventive film is anisotropically formed on surface portions of the structure toward the substrate 11, such that the thickness of the silicon oxide film 36 is constant (FIG. 4D). In this case, the silicon oxide film 36 is substantially formed only on the surface portions which are parallel to the substrate 11. In other words, the silicon oxide film 36 is formed only on the upper surface of the dummy electrode 31 and the exposed surface of the substrate 11; and substantially no film is formed on side surfaces thereof. Thereafter, the dummy gate electrode 31 is removed by dry-etching using a $CF_4+O_2$ gas. After the dummy gate electrode 31 is removed, an opening 36' is formed in a portion of the silicon nitride film 36 corresponding to the region on which the dummy electrode 31 was formed (FIG. 4E). Note that when the dummy gate electrode 31 is removed, the silicon oxide film 36 formed thereon is also removed.

Figure 4F:
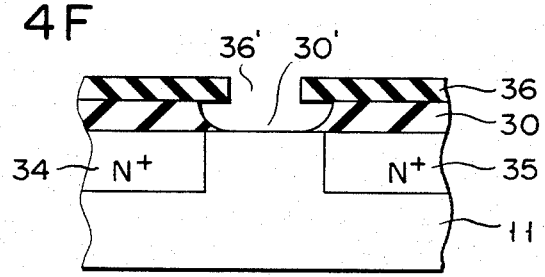
Figure 4G:
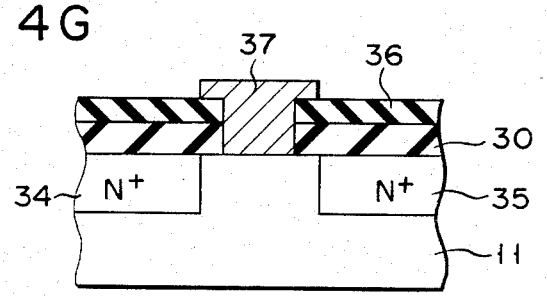

Subsequently, the silicon nitride film 30 is patterned using the silicon oxide film 36 formed thereon as a mask so as to form an opening 30' in a region of the silicon nitride film 30 corresponding to the opening 36' (FIG. 4F). This patterning of the silicon nitride film 30 can be performed by continuing etching of the dummy gate electrode 31 after removal thereof. Thereafter, a metal film is formed on the substrate 11 by deposition and is patterned to form a gate electrode 37 which is in contact with the substrate 11 through the openings 36' and 30' (FIG. 4G).

In this manner, the manufacturing method of the present invention is performed.

In the method described above, the respective distances between the gate electrode 37 and the source and drain regions 34 and 35 are controlled by the thickness of the silicon oxide film 33. The thickness of the silicon oxide film 33 can be controlled in units of several tens of angstroms. Therefore, the breakdown voltage of an element can be improved.

Since ion-implantation of an impurity is performed and the ion-implanted ions are annealed to be activated, formation of the damaged layer can be prevented and evaporation of As from the substrate 11 can also be prevented.

Note that the present invention is not limited to the embodiment described above. For example, a phosphorus-silicate glass (PSG) film can be used in place of the silicon nitride film 30 as the protection film. A film of a refractory metal (e.g., TiW, MoSi, Mo, or the like) can be used as the dummy gate electrode 31 in place of the polysilicon film. The thickness of the film 33 is not limited to about 2,000 Å and can be freely determined. Furthermore, the patterning of the silicon nitride film 30 can be performed not by continuing the etching of the dummy gate electrode 31, but by a separate etching.

It is to be understood that the present invention is not limited to the particular embodiment described above and that various embodiments may be effected therein by one skilled in the art without departing from the spirit or scope of the present invention.

What is claimed is:

1. A method of manufacturing a semiconductor device, comprising the steps of:
   forming an insulating protection film on a semiconductor substrate;
   forming a dummy gate electrode on said protection film;
   forming a distance setting film having a constant thickness on an exposed surface of said protection film and upper and side surfaces of said dummy gate electrode;
   ion-implanting an impurity in said semiconductor substrate using said dummy gate electrode and regions of said distance setting film which are respectively formed on the upper and side surfaces of said dummy gate electrode as a mask so as to a form source and drain region, respectively;
   etching said distance setting film;
   forming an etching preventive film on an exposed surface of said protection film;
   etching said dummy gate electrode using said etching preventive film formed on said protection film as a mask so as to form a first opening;
   etching a region of said protection film corresponding to a region in which said dummy gate electrode was present so as to form a second opening thereby exposing a portion of said semiconductor substrate; and
   forming a metal gate electrode to be in contact with said semiconductor substrate through said first and second openings.

2. A method according to claim 1, wherein the step of forming said second opening is performed by continuing the step of etching said dummy gate electrode.

3. A method according to claim 1, wherein said semiconductor substrate is a gallium arsenide substrate.

4. A method according to claim 1, wherein said protection film is a silicon nitride film formed by plasma chemical vapor deposition.

5. A method according to claim 1, wherein said distance setting film is a silicon oxide film formed by plasma chemical vapor deposition.

6. A method according to claim 1, wherein said etching preventive film is a silicon oxide film formed by sputtering chemical vapor deposition.

* * * * *